United States Patent
Wu et al.

(10) Patent No.: US 6,383,693 B1
(45) Date of Patent: May 7, 2002

(54) METHOD OF FORMING A PHOTOMASK UTILIZING ELECTRON BEAM DOSAGE COMPENSATION METHOD EMPLOYING DUMMY PATTERN

(75) Inventors: Tsiao-Chen Wu, Tucheng; Fei-Gwo Tsai, Hsin-Chu, both of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/645,082

(22) Filed: Aug. 24, 2000

(51) Int. Cl.⁷ .................. G03F 9/00; G03C 5/00
(52) U.S. Cl. .............. 430/5; 430/296; 430/313; 430/394; 430/942
(58) Field of Search .................. 430/5, 296, 313, 430/394, 942

(56) References Cited

U.S. PATENT DOCUMENTS

| | | | |
|---|---|---|---|
| 5,656,399 A | 8/1997 | Abate et al. | 430/5 |
| 5,804,339 A | 9/1998 | Kim | 430/5 |
| 5,994,009 A | 11/1999 | Tzu et al. | 430/30 |
| 6,035,113 A | 3/2000 | Gerber et al. | 395/500.2 |

*Primary Examiner*—Christopher G. Young
(74) *Attorney, Agent, or Firm*—Tung & Associates

(57) ABSTRACT

A method for forming a patterned target layer from a blanket target layer while employing a blanket photoresist layer in conjunction with an exposure method which is susceptible to a proximity effect employs when exposing the blanket photoresist layer to form an exposed blanket photoresist layer a main latent pattern and a second latent pattern adjacent the main latent pattern. Each patterned photoresist layer formed upon developing the main latent pattern is formed of a first linewidth such that not all of a first portion of the blanket target layer formed therebeneath is etched within an isotropic etchant which is employed for etching the blanket target layer to form the patterned target layer. In contrast, each patterned photoresist layer formed upon developing the second latent pattern is formed of a second linewidth such that all of a second portion of the blanket target layer formed therebeneath is etched within the isotropic etchant which is employed for etching the blanket target layer to form the patterned target layer. The method is particularly useful for efficiently forming a photomask while attenuating a proximity effect.

16 Claims, 2 Drawing Sheets

METHOD OF FORMING A PHOTOMASK UTILIZING ELECTRON BEAM DOSAGE COMPENSATION METHOD EMPLOYING DUMMY PATTERN

BACKGROUND OF THE INVENTION

1. Field of the Invention

The present invention relates generally to lithographic methods employed for fabricating microelectronic fabrications. More particularly, the present invention relates to electron beam dosage compensation lithographic methods employed for fabricating microelectronic fabrications.

2. Description of the Related Art

Microelectronic fabrications are formed from microelectronic substrates over which are formed patterned microelectronic conductor layers which are separated by microelectronic dielectric layers. In the process of forming patterned microelectronic conductor layers within microelectronic fabrications, as well as in the process of forming other types of patterned microelectronic layers within microelectronic fabrications, further as well as in the process of forming patterned masking layers within photomasks which may be employed for forming patterned microelectronic layers of various varieties within microelectronic fabrications, there may be employed direct lithographic writing methods, such as but not limited to direct electron beam lithographic writing methods, to form within a blanket photoresist layer a latent electron beam exposed pattern which upon subsequent development provides a patterned photoresist mask for: (1) etching within a microelectronic fabrication a blanket microelectronic layer formed beneath the patterned photoresist mask to form a patterned microelectronic layer formed beneath the patterned photoresist mask; or in the alternative (2) etching within a photomask a blanket masking layer formed beneath the patterned photoresist mask to form a patterned masking layer formed beneath the patterned photoresist mask.

While direct electron beam lithographic methods are thus desirable within the art of microelectronic fabrication for forming electron beam exposed and subsequently patterned photoresist layers which are employed either directly or indirectly for forming patterned microelectronic layers within microelectronic fabrications, direct electron beam lithographic methods are nonetheless not entirely without problems in the art of microelectronic fabrication for forming electron beam exposed and subsequently patterned photoresist layers which are employed either directly or indirectly for forming patterned microelectronic layers within microelectronic fabrications.

In that regard, it is known in the art of microelectronic fabrication that electron beam exposed (directly written) and subsequently developed patterned photoresist layers are often difficult to form with uniform and anticipated linewidth resolution and fidelity encompassing various areal densities of patterned photoresist layers within microelectronic fabrications insofar as electron beam radiation when employed for directly forming patterned photoresist layers within microelectronic fabrications scatters from either within a blanket photoresist layer which is directly exposed while employing electron beam radiation (i.e., forward scattering), or in the alternative electron beam radiation also scatters from a substrate over which is formed a blanket photoresist layer which is directly exposed employing electron beam radiation (i.e., back scattering). Such forward scattering or back scattering leads to pattern density related inhomogeneity effects, such as pattern resolution inhomogeneity effects and patterned fidelity inhomogeneity effects, such inhomogeneity effects generally known in the art of microelectronic fabrication as proximity effects.

It is thus towards the goal of providing within the art of microelectronic fabrication methods and materials through which there may be attenuated proximity effects when exposing a blanket photoresist layer while employing an electron beam method in the process of forming from the blanket photoresist layer a patterned photoresist layer, such that a patterned microelectronic layer formed while employing the patterned photoresist layer as an etch mask may similarly also be formed with uniform and anticipated linewidth resolution and fidelity.

It is towards the foregoing objects that the present invention is directed.

Various methods have been disclosed in the art of microelectronic fabrication for forming with enhanced linewidth resolution within microelectronic fabrications or enhanced linewidth fidelity within microelectronic fabrications patterned microelectronic layers within microelectronic fabrications.

For example, Abate et al., in U.S. Pat. No. 5,656,399, discloses a method for fabricating an x-ray photomask wherein there is compensated for non-collimated x-ray beam exposure effects such as global divergence, local divergence and dose non-uniformity within a patterned photoresist layer which is formed from a blanket photoresist layer formed over a microelectronic substrate while employing the x-ray photomask. To realize the foregoing object, the method provides for an adjustment within the x-ray photomask of the locations of patterned features within the x-ray photomask such as to compensate for the non-collimated x-ray beam exposure effects.

In addition, Kim, in U.S. Pat. No. 5,804,339, discloses an electron beam exposure method for forming for use when fabricating a microelectronic fabrication a photomask with an enhanced fidelity ratio of a series of patterned features within the photomask. To realize the foregoing object, the electron beam exposure method employs when fabricating the photomask, and in addition to a primary electron beam exposure of a blanket photoresist layer employed for forming the photomask, a secondary electron beam correction exposure of the blanket photoresist layer, where the secondary electron beam correction exposure is in a range of from about 0.75 to about 2.25 percent of the primary electron beam exposure.

Further, Tzu et al., in U.S. Pat. No. 5,994,009, discloses an electron beam exposure method for forming within a microelectronic fabrication a patterned microelectronic layer within attenuated proximity effect, in particular under circumstances where the patterned microelectronic layer is formed over a topographically varied substrate layer. To realize the foregoing object, the method employs when forming a photomask employed for forming the patterned microelectronic layer: (1) a first proximity effect correction which is directed towards an optical (i.e., electron beam exposure) proximity effect within the photomask; and (2) a second proximity effect correction which is directed towards a process related (i.e., topographic substrate) proximity effect within the photomask.

Finally, Gerber et al., in U.S. Pat. No. 6,035,113, discloses a method for efficiently compensating for a proximity effect when fabricating while employing an electron beam lithographic method a photomask, even under circumstances where there is employed when fabricating the photomask a complex hierarchal design data set. To realize the foregoing object, the method employs a multiple gaussian approximation, where short term gaussian terms are treated as forward scatter terms and long term gaussian terms are treated as back scatter terms.

Desirable in the art of microelectronic fabrication are additional methods and materials which may be employed for attenuating when exposing a blanket photoresist layer while employing an electron beam method proximity effects.

It is towards the foregoing object that the present invention is directed.

SUMMARY OF THE INVENTION

A first object of the present invention is to provide an electron beam method for exposing a blanket photoresist layer.

A second object of the present invention is to provide an electron beam method in accord with the first object of the present invention wherein there is attenuated a proximity effect when exposing the blanket photoresist layer while employing the electron beam method.

A third object of the present invention is to provide a method in accord with the first object of the invention and the second object of the invention, wherein the method is readily commercially implemented.

In accord with the objects of the present invention, there is provided by the present invention a method for forming a patterned layer within a microelectronic fabrication. To practice the method of the present invention, there is first provided a substrate. There is then formed over the substrate a blanket target layer. There is then formed over the blanket target layer a blanket photoresist layer. There is then exposed, while employing a radiation beam method susceptible to a proximity effect, the blanket photoresist layer to form an exposed blanket photoresist layer which comprises: (1) a main latent pattern comprising a first series of latent patterns; and (2) a second latent pattern comprising a second series of latent patterns adjacent the first series of latent patterns. There is then developed the exposed blanket photoresist layer to form a corresponding patterned photoresist layer comprising: (1) a corresponding main photoresist pattern comprising a first series of patterned photoresist layers; and (2) a corresponding second photoresist pattern comprising a second series of patterned photoresist layers adjacent the first series of patterned photoresist layers. There is then etched, while employing an etchant, and while employing the patterned photoresist layer as an etch mask layer, the blanket target layer to form a patterned target layer, wherein: (1) each patterned photoresist layer within the first series of patterned photoresist layers has a first linewidth such that not all of a first portion of the blanket target layer beneath the main photoresist pattern is completely etched within the etchant; and (2) each patterned photoresist layer within the second series of patterned photoresist layers has a second linewidth such that all of a second portion of the blanket target layer beneath the second photoresist pattern is completely etched within the etchant.

The present invention is particularly useful when fabricating a photomask while employing the method of the present invention.

The present invention provides an electron beam method for exposing a blanket photoresist layer, where there is attenuated a proximity effect when exposing the blanket photoresist layer while employing the electron beam method. The present invention realizes the foregoing object in part by employing when exposing a blanket photoresist layer while employing an electron beam method: (1) a main latent pattern comprising a first series of latent patterns; and (2) a second (dummy) latent pattern comprising a second series of latent patterns adjacent the first series of latent patterns, wherein upon developing the main latent pattern to form a main photoresist pattern comprising a first series of patterned photoresist layers and developing the second latent pattern to form a second photoresist pattern comprising a second series of patterned photoresist layers: (1) each patterned photoresist layer within the first series of patterned photoresist layers has a first linewidth such that not all of a first portion of a blanket target layer formed beneath the main photoresist pattern is completely etched within an etchant; and (2) each patterned photoresist layer within the second series of patterned photoresist layers has a second linewidth such that all of a second portion of the blanket target layer formed beneath the second photoresist pattern is completely etched within the etchant.

The present invention is readily commercially implemented. The present invention employs methods and materials as are generally known in the art of microelectronic fabrication, but employed within the context of particular design limitations which provide at least in part the present invention. Since it is at least in part a design limitation which provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an electron beam method for exposing a blanket photoresist layer, where there is attenuated a proximity effect when exposing the blanket photoresist layer while employing the electron beam method. The present invention realizes the foregoing object in part by employing when exposing a blanket photoresist layer while employing an electron beam method: (1) a main latent pattern comprising a first series of latent patterns; and (2) a second (dummy) latent pattern comprising a second series of latent patterns adjacent the first series of latent patterns, wherein upon developing the main latent pattern to form a main photoresist pattern comprising a first series of patterned photoresist layers and developing the second latent pattern to form a second photoresist pattern comprising a second series of patterned photoresist layers: (1) each patterned photoresist layer within the first series of patterned photoresist layers has a first linewidth such that not all of a first portion of a blanket target layer formed beneath the main photoresist pattern is completely etched within an isotropic etchant; and (2) each patterned photoresist layer within the second series of patterned photoresist layers has a second linewidth such that all of a second portion of the blanket target layer formed beneath the second photoresist pattern is completely etched within the isotropic etchant.

While the preferred embodiment of the present invention illustrates the present invention most particularly with respect to forming within a photomask from a blanket masking layer a patterned masking layer formed with uniform and anticipated linewidth resolution and fidelity while employing the method of the present invention, the present invention may similarly also be employed for forming from blanket target layers including but not limited to blanket conductor target layers, blanket semiconductor target layers and blanket dielectric target layers while employing a lithographic method which is susceptible to a proximity effect a corresponding patterned target layer with a uniform and anticipated linewidth resolution and fidelity within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
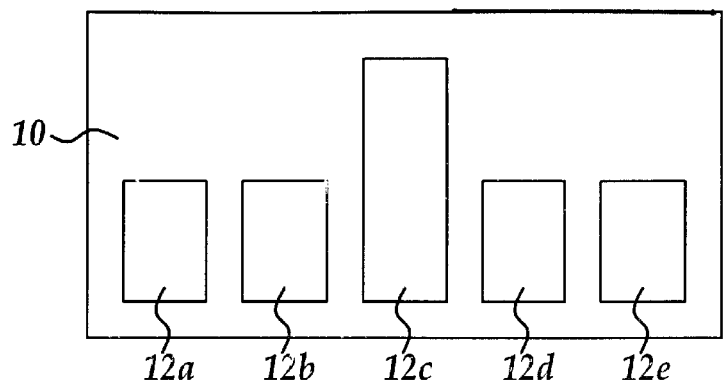
FIG. 1 shows a schematic plan view diagram of an ideal photomask comprising a transparent substrate having formed thereover a series of expected patterned masking layers.

Referring now to FIG. 1, there is shown a schematic plan view diagram of an ideal photomask comprising a transparent substrate 10 having formed thereupon and thereover a series of expected patterned masking layers 12a, 12b, 12c, 12d and 12e. As is illustrated within the schematic plan view diagram of FIG. 1, the expected patterned masking layer 12c is a comparatively loose expected patterned masking layer, while each of the expected patterned masking layers 12a, 12b, 12d and 12e is a comparatively dense expected patterned masking layer. The ideal photomask whose schematic plan view diagram of FIG. 1 is intended for comparison purposes to illustrate the value of the present invention.

Figure 2:
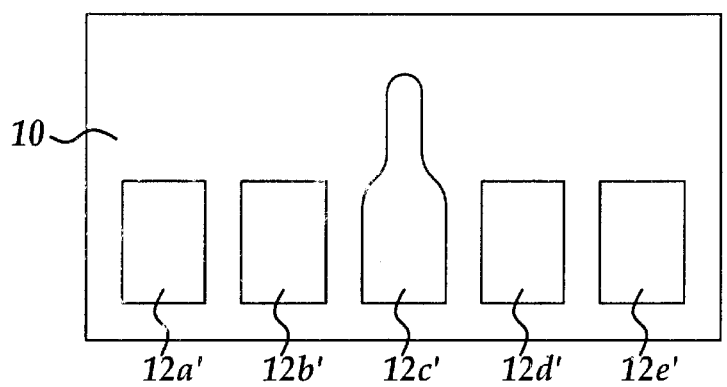
FIG. 2 shows a schematic plan view diagram of an actual photomask comprising a transparent substrate having formed thereover a series of actual patterned masking layers.

Referring now to FIG. 2, there is shown a schematic plan view diagram illustrating an actual photomask which is typically actually formed while employing a electron beam lithographic method, for purposes of comparison with the ideal photomask whose schematic plan view diagram is illustrated in FIG. 1.

Shown in FIG. 2 is the same transparent substrate 10 as is illustrated within the ideal photomask whose schematic plan view diagram of FIG. 1, but wherein there is instead formed thereupon and thereover a series of actual patterned masking layers 12a', 12b', 12c', 12d' and 12e' rather than the series of expected patterned masking layers 12a, 12b, 12c, 12d and 12e, as illustrated within the ideal photomask whose schematic plan view diagram is illustrated in FIG. 1. Analogously with the schematic plan view diagram of FIG. 1, the actual patterned masking layer 12c' is a comparatively loose actual patterned masking layer, while each actual patterned masking layer within the series of actual patterned masking layers 12a', 12b', 12d' and 12e' is a comparatively dense actual patterned masking layer.

Similarly, as is illustrated within the schematic plan view diagram of FIG. 2, although the series of actual patterned masking layers 12a', 12b', 12d' and 12e' is formed with dimensions analogous or equivalent to the dimensions of the expected patterned masking layers 12a, 12b, 12d and 12e, the actual patterned layer 12c' has a tendency, when being formed employing a electron beam lithographic method which is susceptible to a proximity effect, to be formed with a thinner than expected dimension at a location where the actual patterned masking layer 12c' is formed adjoining an open area of the photomask whose schematic plan view diagram is illustrated in FIG. 2. It is towards the goal of providing an electron beam lithographic method which attenuates the proximity effect which provides the actual patterned masking layer 12c' within the photomask whose schematic plan view diagram is illustrated in FIG. 2 with a comparatively narrow top portion that the present invention is directed.

Referring now to FIG. 3 to FIG. 7, there is shown a series of schematic plan view and cross-sectional diagrams illustrating the results of progressive stages in forming a photomask in accord with a preferred embodiment of the present invention.

Figure 3:
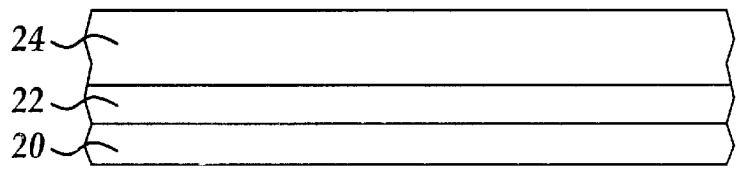
FIG. 3, FIG. 4, FIG. 5, FIG. 6, FIG. 7 and FIG. 8 show a series of schematic cross-sectional and schematic plan view diagrams illustrating the results of progressive stages in forming a photomask in accord with a preferred embodiment of the present invention.

Shown in FIG. 3, is a schematic plan view diagram of the photomask at an early stage in its fabrication in accord with the preferred embodiment of the present invention.

Shown in FIG. 3 is a photomask comprising a transparent substrate 20 having formed thereupon and thereover a blanket masking layer 22 in turn having formed thereupon and thereover a blanket photoresist layer 24.

Within the preferred embodiment of the present invention with respect to the transparent substrate 20, the transparent substrate 20 may be formed from any of several transparent materials as are common in the art of microelectronic fabrication, from which transparent materials may be formed transparent substrates for use within photomasks. Such transparent materials may include, but are not limited to transparent quartz materials and transparent glass materials, although transparent quartz materials are more common within the art of microelectronic fabrication for use when forming transparent substrates employed when forming photomasks. Typically and preferably, the transparent substrate 20 is formed to a thickness of from about 60 to about 250 mils, which is typically sufficient to provide structural stability when forming the photomask whose schematic cross-sectional diagram is illustrated in FIG. 3.

Within the preferred embodiment of the present invention with respect to the blanket masking layer 22, the blanket masking layer 22 will typically and preferably be formed of a masking material which is opaque to a wavelength of light which is employed to photoexpose a photoresist layer while employing a completed photomask formed from the photomask whose schematic cross-sectional diagram is illustrated in FIG. 3. Typically and preferably, the blanket masking layer 22 will be formed of a conductor masking material, such as but not limited to a conductor metal masking material, further such as but not limited to a chromium conductor metal masking material, as is most common in the art of photomask fabrication, although other masking materials, such as but not limited to other conductor masking materials, semiconductor masking materials and dielectric masking materials, may also be employed within the preferred embodiment of the present invention. Typically and preferably, the blanket masking layer 22 when formed of a chromium conductor metal masking material is formed to a thickness of from about 700 to about 1,000 angstroms.

Finally, within the preferred embodiment of the present invention with respect to the blanket photoresist layer 24, the blanket photoresist layer 24 is typically and preferably formed of a positive photoresist material, and more typically and preferably formed of polymethylmethacrylate (PMMA), ZEP, novolak resin or PHS although under certain circumstances the present invention may also provide value when a negative photoresist material is employed when forming the blanket photoresist layer 24. Typically and preferably, the blanket photoresist layer 24 is formed to a thickness of from about 2,500 to about 5,000 angstroms.

As is noted above, and as is understood by a person skilled in the art, although the preferred embodiment of the present invention illustrates the present invention within the context of fabricating a photomask in accord with the present invention, the present invention may also be employed for forming with uniform and anticipated linewidth resolution and fidelity patterned layers of various varieties for use within microelectronic fabrications.

Under such circumstances, the transparent substrate 20 as illustrated within the schematic cross-sectional diagram of FIG. 1 is instead replaced with a substrate employed within a microelectronic fabrication, where the microelectronic fabrication may be selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications. Similarly, and also under such circumstances, the blanket masking layer 22 is instead replaced with a blanket target layer, where the blanket target layer may be formed from a target material selected from the group including but not limited to conductor target materials, semiconductor target materials and dielectric target materials. Typically and preferably, the blanket target layer is formed to a thickness of from about 700 to about 1,000 angstroms. Finally, and also under such circumstances, the blanket photoresist layer 24 remains the same within the present invention whether one is fabricating while employing the present invention a photomask in accord with the preferred embodiment of the present invention, or in the alternative a microelectronic fabrication in accord with the present invention.

Figure 4:
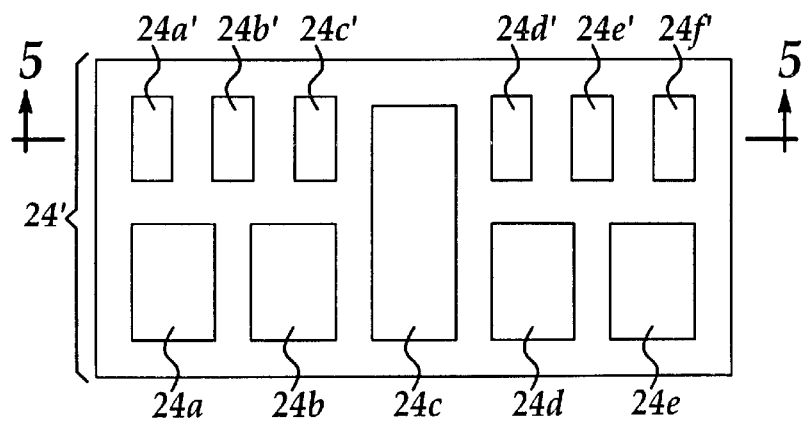

Referring now to FIG. 4, there is shown a schematic plan view diagram illustrating the results of further processing of the photomask whose schematic cross-sectional diagram is illustrated in FIG. 3.

Shown in FIG. 4 is a schematic plan view diagram of a photomask otherwise equivalent to the photomask whose schematic cross-sectional diagram is illustrated in FIG. 3, but wherein the blanket photoresist layer 24 has been electron beam exposed to form an electron beam exposed blanket photoresist layer 24' having formed therein two separate series of latent patterns. A first of the two series of latent patterns comprises a series main latent patterns 24a, 24b, 24c, 24d and 24e which forms a main latent pattern within the electron beam exposed blanket photoresist layer 24'. Similarly, a second of the two series of latent patterns comprises a series of secondary latent patterns 24a', 24b', 24c', 24d', 24e' and 24f' which forms a secondary latent pattern within the electron beam exposed blanket photoresist layer 24' adjacent the main latent pattern within the electron beam exposed blanket photoresist layer 24'. Typically and preferably, none of the series of main latent patterns 24a, 24b, 24c, 24d and 24e within the main latent pattern is connected to the series of secondary latent patterns 24a', 24b', 24c', 24d', 24e', and 24f' within the second latent pattern.

Within the present invention and the preferred embodiment of the present invention, the series of secondary latent patterns 24a', 24b', 24c', 24d', 24e' and 24f' provides for an attenuated proximity effect within the series of main latent patterns 24a, 24b, 24c, 24d and 24e when forming from the blanket photoresist layer 24 as illustrated within the schematic cross-sectional diagram of FIG. 3 the electron beam exposed blanket photoresist layer 24' as illustrated within the schematic cross-sectional diagram of FIG. 4. Within the preferred embodiment of the present invention, the electron beam exposure of the blanket photoresist layer 24 as illustrated within the schematic cross-sectional diagram of FIG. 3 to provide the electron beam exposed blanket photoresist layer 24' as illustrated within the schematic plan view diagram of FIG. 4 may be undertaken with only a single primary electron beam exposure dose and no independent second compensation electron beam exposure dose, although such compensation may also be employed within the method of the present invention.

Similarly, although from a practical perspective the present invention provides most value when the blanket photoresist layer 24 as illustrated within the photomask whose schematic cross-sectional diagram is illustrated in FIG. 3 is electron beam exposed to form the electron beam exposed blanket photoresist layer 24' whose schematic plan view diagram is illustrated in FIG. 4, the method of the present invention provides value under conditions where there is employed for exposing a blanket photoresist layer any type of exposure method which might otherwise provide within an exposed blanket photoresist layer a proximity effect. Such other exposure methods may include, but are not limited to ion exposure methods.

Figure 5:
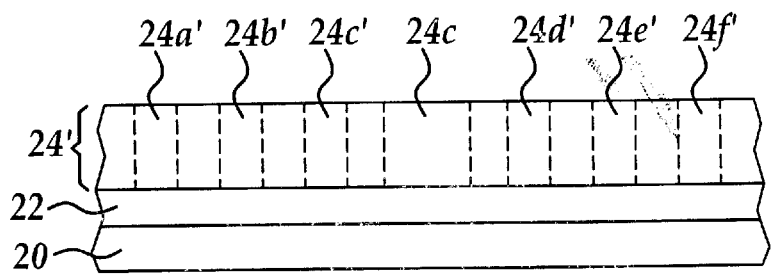

Referring now to FIG. 5, there is shown a schematic cross-sectional diagram of a photomask corresponding with the photomask whose schematic plan view diagram is illustrated in FIG. 4.

As is illustrated within the schematic cross-sectional diagram of FIG. 5, there is again shown the transparent substrate having formed thereupon and thereover the blanket masking layer 22, in turn having formed thereupon the electron beam exposed blanket photoresist layer 24' which comprises the main latent pattern 24c having adjacent thereto the series of secondary latent patterns 24a', 24b', 24c', 24d', 24e' and 24f'.

Figure 6:
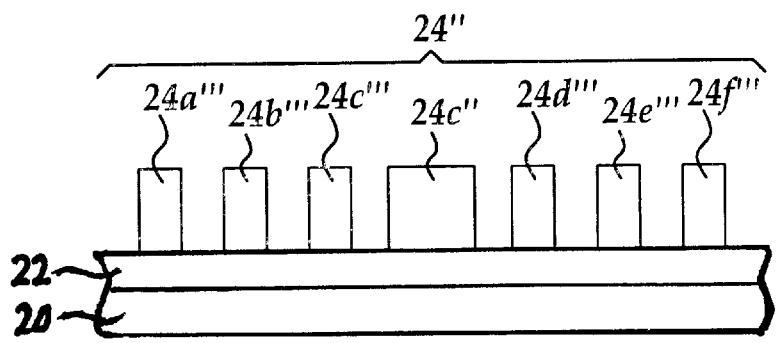

Referring now to FIG. 6, there is shown a schematic cross-sectional diagram illustrating the results of further processing of the photomask whose schematic cross-sectional diagram is illustrated in FIG. 5.

Shown in FIG. 6 is a schematic cross-sectional diagram of a photomask otherwise equivalent to the photomask whose schematic cross-sectional diagram is illustrated in FIG. 5, but wherein the electron beam exposed blanket photoresist layer 24' has been developed to form a series of patterned photoresist layers which comprises a main patterned photoresist layer 24c'', along with a series of secondary patterned photoresist layers 24a''', 24b''', 24c''', 24d''', 24e''' and 24f'''.

To form the photomask whose schematic cross-sectional diagram is illustrated in FIG. 6 from the photomask whose schematic cross-sectional diagram is illustrated in FIG. 5, there is typically and preferably employed a photoresist developer material appropriate for the material from which is formed the electron beam exposed blanket photoresist layer 24'. Under conditions where the electron beam exposed blanket photoresist layer 24' is formed of a polymethylmethacrylate (PMMA) positive photoresist material, a photoresist developer which may be employed for forming from the electron beam exposed blanket photoresist layer 24' the patterned photoresist layer 24'' is typically and preferably a water-based or solvent-based photoresist developer solution, such as but not limited to a tetramethylammonium hydroxide (TMAH) alkaline photoresist developer solution or pentanone.

Within the present invention and the preferred embodiment of the present invention as illustrated within the schematic cross-sectional diagram of FIG. 6, each patterned photoresist layer which comprises a main photoresist pattern, such as the main patterned photoresist layer 24c'' within the main photoresist pattern, has a first linewidth such that not all of the blanket target layer 22 beneath the main photoresist pattern is completely etched within an isotropic etchant which is employed to form from the blanket target layer 22 a patterned target layer while employing the patterned photoresist layer 24'' as an etch mask layer. Similarly, within the present invention and the preferred embodiment of the present invention as illustrated within the schematic cross-sectional diagram of FIG. 6, each secondary patterned photoresist layer within the second photoresist pattern which comprises the secondary patterned photoresist layers 24a''', 24b''', 24c''', 24d''', 24e''' and 24f''' has a second linewidth such that all of a second portion of the blanket target layer 22 beneath the second photoresist pattern is completely etched within the isotropic etchant when forming the patterned target layer from the blanket target layer 22 while employing the patterned photoresist layer 24'' as the etch mask layer.

Figure 7:
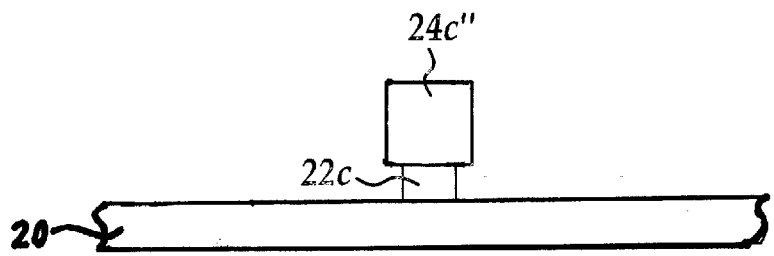

Referring now to FIG. 7, there is shown a schematic cross-sectional diagram illustrating the results of further processing of the photomask whose schematic cross-sectional diagram is illustrated in FIG. 6.

Shown in FIG. 7 is a schematic cross-sectional diagram of a photomask otherwise equivalent to the photomask whose schematic cross-sectional diagram is illustrated in FIG. 6, but wherein the blanket masking layer 22 has been patterned to form the patterned masking layer 22c. Within the present invention and the preferred embodiment of the present invention, the blanket masking layer 22 is patterned to form the patterned masking layer 22c while employing an isotropic etchant, such that, as noted above, all portions of the blanket masking layer 22 beneath the series of secondary patterned photoresist layers 24a''', 24b''', 24c''', 24d''', 24e''' and 24f''' are etched within the isotropic etchant, while not all of the blanket masking layer 22 formed beneath the main patterned masking layer 24c''' is etched within the isotropic etchant. Within the present invention and the preferred embodiment of the present invention, the etchant may be selected from the group including but not limited to wet chemical etchants and dry plasma etchants, where the dry plasma etchants to be effective within the present invention are typically and preferably employed at a higher etching pressure of from about 5 to about 10 mtorr.

Within the preferred embodiment of the present invention when forming a photomask where the blanket masking layer 22 is formed of a chromium conductor masking material, the blanket masking layer 22 is etched to form the patterned masking layer 22c within a wet chemical etchant comprising CR-7. Similarly, under such circumstances, the wet chemical etchant comprising ceric ammonium nitrate provides an undercut when forming the patterned masking layer 22c from the blanket masking layer 22 of from about 0.2 to about 10 microns beneath each side of the main patterned photoresist layer 24c''', thus within the preferred embodiment of the present invention, the secondary patterned photoresist layers 24a''', 24b''', 24c''', 24d''', 24e''' and 24f''' are typically and preferably formed of a linewidth no greater than about 0.01 to about 0.2 microns.

Figure 8:
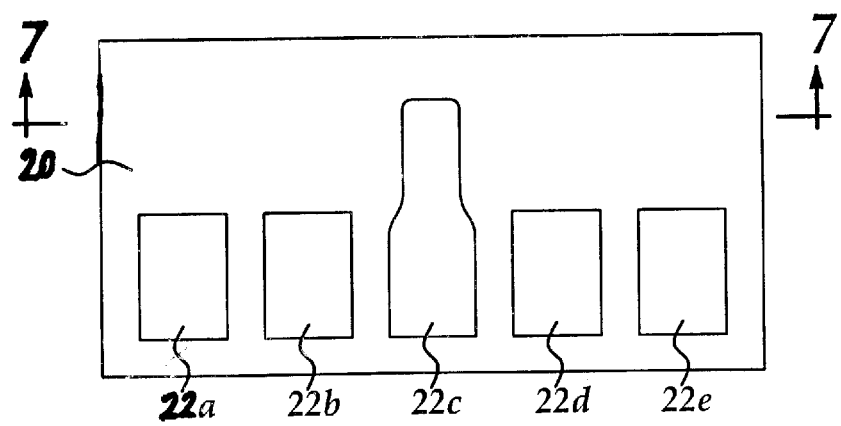

Referring now to FIG. 8, there is shown a schematic planview diagram of a photomask corresponding in part with the photomask whose schematic cross-sectional diagram is illustrated in FIG. 7.

Shown in FIG. 8 is a schematic plan view diagram of a photomask which illustrates the transparent substrate 20 having formed thereupon a series of patterned masking layers 22a, 22b, 22c, 22d and 22e which comprises a main pattern of the patterned masking layer. Noticeable in light of its absence within the photomask whose schematic diagram is illustrated in FIG. 8 is a series of secondary patterned masking layers which correspond with the series of secondary patterned photoresist layers 24a''', 24b''', 24c''', 24d''', 24e''' and 24f'''. As is noted above, such secondary patterned masking layers are absent since the series of secondary patterned photoresist layers 24a''', 24b''', 24c''', 24d''', 24e''' and 24f''' is formed of a linewidth such that all of a second portion of the blanket masking layer 22 formed therebeneath is completely etched when forming the series of patterned masking layers 22a, 22b, 22c, 22d and 22e from the corresponding blanket masking layer 22.

In general, to form the photomask whose schematic plan view diagram is illustrated in FIG. 8 from the photomask whose schematic cross-sectional diagram is illustrated in FIG. 7, there is stripped from the photomask whose schematic cross-sectional diagram is illustrated in FIG. 7 a series of main patterned photoresist layers which includes the main patterned photoresist layer 24c'''. The series of main patterned photoresist layers may be stripped employing methods as are conventional in the art of microelectronic fabrication, including but not limited to wet chemical stripping methods, dry plasma stripping methods and aggregate methods thereof.

As is illustrated within the schematic plan view diagram of FIG. 8 in comparison with the schematic plan view diagram of FIG. 2, the patterned masking layer 22c is formed with a more uniform and anticipated linewidth resolution and fidelity in comparison with the actual patterned masking layer 12c' insofar as there is employed within the present invention the secondary latent patterns 24a', 24b', 24c', 24d', 24e' and 24f' when forming from the blanket photoresist layer 24 as illustrated within the schematic cross-sectional diagram of FIG. 3 the electron beam exposed blanket photoresist layer 24' as illustrated within the schematic plan view diagram of FIG. 4. For purposes of comparison, and within the context of a patterned masking layer 22c having a desired linewidth of from about 0.5 to about 2 microns, the present invention reduces a thinning of an upper portion of the patterned masking layer 22c with respect to a lower portion of the patterned masking layer 22c of from about 0.030 microns without the present invention to less than 0.020 microns with the present invention.

As is understood by a person skilled in the art, the preferred embodiment of the present invention is illustrative of the present invention rather than limiting of the present invention. Revisions and modifications may be made to methods, materials, structures and dimensions through which may be fabricated a photomask, or in the alternative a microelectronic fabrication, in accord with the preferred embodiment of the present invention while still fabricating a photomask, or in the alternative a microelectronic fabrication, in accord with the present invention, further in accord with the accompanying claims.

What is claimed is:

1. A method for forming a patterned layer comprising:
   providing a substrate;

forming over the substrate a blanket target layer;

forming over the blanket target layer a blanket photoresist layer;

exposing, while employing a radiation beam method susceptible to a proximity effect, the blanket photoresist layer to form an exposed blanket photoresist layer which comprises:
  a main latent pattern comprising a first series of latent patterns; and
  a second latent pattern comprising a second series of latent patterns adjacent the first series of latent patterns;

developing the exposed blanket photoresist layer to form a corresponding patterned photoresist layer comprising:
  a corresponding main photoresist pattern comprising a first series of patterned photoresist layers; and
  a corresponding second photoresist pattern comprising a second series of patterned photoresist layers adjacent the first series of patterned photoresist layers;

etching, while employing an isotropic etchant, and while employing the patterned photoresist layer as an etch mask layer, the blanket target layer to form a patterned target layer, wherein:
  each patterned photoresist layer within the first series of patterned photoresist layers has a first linewidth such that not all of the blanket target layer beneath the main photoresist pattern is completely etched within the isotropic etchant; and
  each patterned photoresist layer within the second series of patterned photoresist layers has a second linewidth such that all of a second portion of the blanket target layer beneath the second photoresist pattern is completely etched within the isotropic etchant.

2. The method of claim 1 wherein by forming the second latent pattern when exposing the blanket photoresist layer to form the exposed blanket photoresist layer there is attenuated a proximity effect when forming the patterned photoresist layer.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the blanket target layer is formed from a microelectronic material selected from the group consisting of microelectronic conductor materials, microelectronic semiconductor materials and microelectronic dielectric materials.

5. The method of claim 1 wherein the blanket target layer is formed to a thickness of from about 700 to about 1,000 angstroms.

6. The method of claim 1 wherein the radiation beam method is selected from the group consisting of electron beam methods and ion beam methods.

7. The method of claim 1 wherein the isotropic etchant is selected from the group consisting of wet chemical isotropic etchants and dry plasma etchants.

8. The method of claim 1 wherein the first series of latent patterns does not contact the second series of latent patterns.

9. A method for forming a photomask comprising:

providing a transparent substrate;

forming over the transparent substrate a blanket masking layer;

forming over the blanket masking layer a blanket photoresist layer;

exposing, while employing a radiation beam method susceptible to a proximity effect, the blanket photoresist layer to form an exposed blanket photoresist layer which comprises:
  a main latent pattern comprising a first series of latent patterns; and
  a second latent pattern comprising a second series of latent patterns adjacent the first series of latent patterns;

developing the exposed blanket photoresist layer to form a corresponding patterned photoresist layer comprising:
  a corresponding main photoresist pattern comprising a first series of patterned photoresist layers; and
  a corresponding second photoresist pattern comprising a second series of patterned photoresist layers adjacent the first series of patterned photoresist layers;

etching, while employing an isotropic etchant, and while employing the patterned photoresist layer as an etch mask layer, the blanket masking layer to form a patterned masking layer, wherein:
  each patterned photoresist layer within the first series of patterned photoresist layers has a first linewidth such that not all of the blanket masking layer beneath the main photoresist pattern is completely etched within the isotropic etchant; and
  each patterned photoresist layer within the second series of patterned photoresist layers has a second linewidth such that all of a second portion of the blanket masking layer beneath the second photoresist pattern is completely etched within the isotropic etchant.

10. The method of claim 9 wherein by forming the second latent pattern when exposing the blanket photoresist layer to form the exposed blanket photoresist layer there is attenuated a proximity effect when forming the patterned photoresist layer.

11. The method of claim 9 wherein the transparent substrate is formed from a transparent material selected from the group consisting of transparent quartz materials and transparent glass materials.

12. The method of claim 9 wherein the blanket masking layer is formed from a masking material selected from the group consisting of conductor masking materials, semiconductor masking materials and dielectric masking materials.

13. The method of claim 9 wherein the blanket masking layer is formed to a thickness of from about 2,500 to about 5,000 angstroms.

14. The method of claim 9 wherein the radiation beam method is selected from the group consisting of electron beam methods and ion beam methods.

15. The method of claim 9 wherein the isotropic etchant is selected from the group consisting of wet chemical isotropic etchants and dry plasma isotropic etchants.

16. The method of claim 9 wherein the first series of latent patterns does not contact the second series of latent patterns.

* * * * *